United States Patent
Koo et al.

(10) Patent No.: US 12,308,311 B2
(45) Date of Patent: May 20, 2025

(54) SEMICONDUCTOR DEVICE INCLUDING INTERCONNECTION STRUCTURE INCLUDING MXENE AND METHOD OF MANUFACTURING THE SAME

(71) Applicant: SK hynix Inc., Icheon-si (KR)

(72) Inventors: Won Tae Koo, Icheon-si (KR); Jae Hyun Han, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 431 days.

(21) Appl. No.: 17/707,860

(22) Filed: Mar. 29, 2022

(65) Prior Publication Data
US 2023/0123138 A1  Apr. 20, 2023

(30) Foreign Application Priority Data
Oct. 18, 2021 (KR) .......... 10-2021-0138869

(51) Int. Cl.
*H01L 23/522* (2006.01)
*H01L 21/768* (2006.01)
*H01L 23/532* (2006.01)

(52) U.S. Cl.
CPC .... *H01L 23/5226* (2013.01); *H01L 21/76841* (2013.01); *H01L 23/53223* (2013.01); *H01L 23/53238* (2013.01); *H01L 23/53266* (2013.01)

(58) Field of Classification Search
CPC ....... H01L 23/5226; C01B 2204/00–32; C01B 32/182–198; Y10S 977/734–753
See application file for complete search history.

(56) References Cited

U.S. PATENT DOCUMENTS

2013/0113102 A1* 5/2013 Bao .................. H01L 23/53238
                                                                         977/734
2018/0061665 A1   3/2018 Meade et al.
2018/0166333 A1*  6/2018 Yang ................. H01L 23/53233

FOREIGN PATENT DOCUMENTS

KR   10-2016-0137298 A   11/2016

OTHER PUBLICATIONS

B. Aïssa, A. Ali, K. A. Mahmoud, T. Haddad, M. Nedil; Transport properties of a highly conductive 2D Ti3C2Tx MXene/graphene composite. Appl. Phys. Lett. Jul. 25, 2016; 109 (4): 043109, hereinafter Aïssa (Year: 2016).*

B. Aïssa, A. Ali, K. A. Mahmoud, T. Haddad, M. Nedil; Transport properties of a highly conductive 2D Ti3C2Tx MXene/graphene composite. Appl. Phys. Lett. Jul. 25, 2016; 109 (4): 043109 (Year: 2016).*

* cited by examiner

*Primary Examiner* — Evren Seven
*Assistant Examiner* — Cole Leon Lindsey

(57) ABSTRACT

A semiconductor device includes a first conductive layer including a first metal, a second conductive layer electrically connected to the first conductive layer and including a second metal, and an interconnection structure common to a connection portion of the first and second conductive layers. The interconnection structure may include a seed layer on the first conductive layer that includes graphene, and a metal migration barrier layer on the seed layer that includes MXene.

12 Claims, 12 Drawing Sheets

SEMICONDUCTOR DEVICE INCLUDING INTERCONNECTION STRUCTURE INCLUDING MXENE AND METHOD OF MANUFACTURING THE SAME

CROSS-REFERENCE TO RELATED APPLICATIONS

The present application claims priority under 35 U.S.C. § 119(a) to Korean Application No. 10-2021-0138869, filed on Oct. 18, 2021 in the Korean Intellectual Property Office, which is incorporated herein by reference in its entirety.

BACKGROUND

1. Technical Field

The present disclosure generally relates to a semiconductor device including an interconnection structure, and more particularly, to a semiconductor device having an interconnection structure including MXene.

2. Related Art

A semiconductor device includes a plurality of metal wirings for electrical connection between devices. Contact resistance may occur at a connection portion where different metal wirings are connected to each other. In order for an electrical signal to pass smoothly through a connection portion, the contact resistance at the connection portion needs to be reduced. In addition, electromigration, in which the metal in the metal wiring diffuses in the form of ions, may occur when the temperature of the connection portion increases due to heat from contact resistance during operation of the semiconductor device. Because the electromigration phenomenon deteriorates the structural stability and electrical reliability of metal wiring, it is necessary to prevent or suppress the electromigration phenomenon.

Recently, as the feature size of semiconductor devices continues to decrease, technologies capable of improving the structural stability and electrical reliability in connection portions between metal wirings are in high demand.

SUMMARY

A semiconductor device according to an embodiment of the present disclosure includes a first conductive layer including a first metal, a second conductive layer that is electrically connected to the first conductive layer and that includes a second metal, and an interconnection structure disposed in a connection portion of the first conductive layer and in a connection portion of the second conductive layer. The interconnection structure may include a seed layer disposed on the first conductive layer and including graphene, and a metal migration barrier layer disposed on the seed layer and including MXene.

A semiconductor device according to another embodiment of the present disclosure includes a substrate, a first conductive layer, including a first metal, on the substrate, an interlayer insulation layer disposed on the first conductive layer and including a contact pattern, a seed layer, including graphene, disposed to contact the first conductive layer in the contact pattern, a metal migration barrier layer, including MXene, disposed on the seed layer, and a second conductive layer including a second metal and disposed to contact the metal migration barrier layer.

In a method of manufacturing a semiconductor device according to another embodiment of the present disclosure, a substrate is provided. A first conductive layer including a first metal is formed on the substrate. A seed layer including graphene is formed on at least a portion of the first conductive layer. A metal migration barrier layer including MXene is formed on the seed layer. A second conductive layer including a second metal on the metal migration barrier layer to electrically connect the second conductive layer to the first conductive layer.

DETAILED DESCRIPTION

Figure 1:
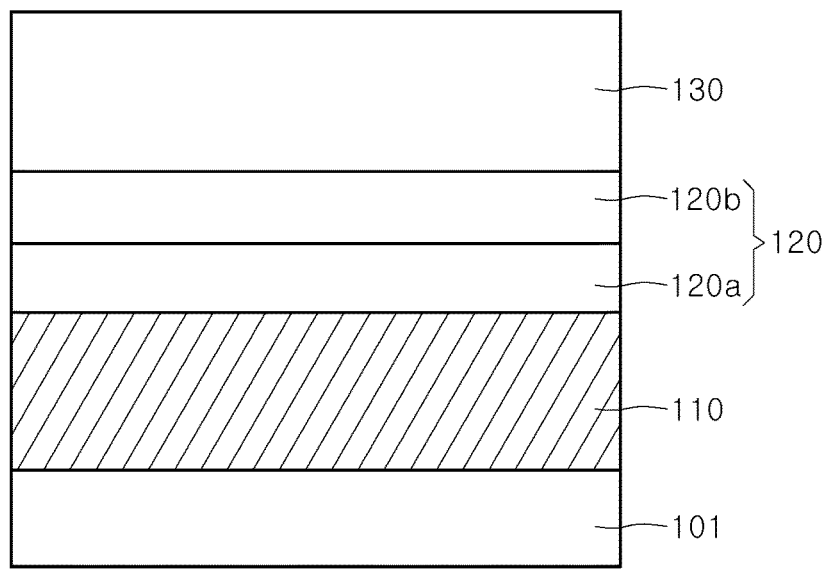
FIG. 1 is a cross-sectional view schematically illustrating a semiconductor device according to an embodiment of the present disclosure.

Hereinafter, embodiments of the present disclosure will be described in detail with reference to the accompanying drawings. In the drawings, in order to clearly express the components of each device, the sizes of the components, such as width and thickness of the components, are enlarged. The terms used herein may correspond to words selected in consideration of their functions in the embodiments, and the meanings of the terms may be construed to be different according to the ordinary skill in the art to which the embodiments belong. If expressly defined in detail, the terms may be construed according to the definitions. Unless otherwise defined, the terms (including technical and scientific terms) used herein have the same meaning as commonly understood by one of ordinary skill in the art to which the embodiments belong.

In addition, expression of a singular form of a word should be understood to include the plural forms of the word unless clearly used otherwise in the context. It will be understood that the terms "comprise", "include", or "have" are intended to specify the presence of a feature, a number, a step, an operation, a component, an element, a part, or combinations thereof, but not used to preclude the presence or possibility of addition one or more other features, numbers, steps, operations, components, elements, parts, or combinations thereof.

Further, in performing a method or a manufacturing method, each process constituting the method can take place differently from the stipulated order unless a specific sequence is described explicitly in the context. In other words, each process may be performed in the same manner as the stated order, and may be performed substantially at the same time. Also, at least a part of each of the above processes may be performed in a reversed order.

The two-dimensional material disclosed herein may refer to a crystalline material in which atoms or molecules are formed in a single monolayer. The atoms or molecules may be bound in the single layer by an intramolecular force such as a covalent bond. The single layer may be coupled to another adjacent layer by an intermolecular force such as a van der Waals force. Accordingly, a plurality of the two-dimensional materials, in the form of single layers, may be stacked in one direction.

Various embodiments of the present disclosure provide semiconductor devices in which graphene and MXene, which are two-dimensional materials, are utilized as interconnection structures between metal wirings. The interconnection structures may reduce contact resistance at a connection portion of the metal wirings and may function as a barrier layer for material movement between the metal wirings in the connection portion.

FIG. 1 is a cross-sectional view schematically illustrating a semiconductor device according to an embodiment of the present disclosure. A semiconductor device 1 may include a substrate 101 and a first conductive layer 110, which includes a first metal, layered on the substrate 101. A second conductive layer 130, which includes a second metal, may be electrically connected to the first conductive layer 110. An interconnection structure 120 may be located common to connection portions of the first and second conductive layers 110 and 130. The interconnection structure 120 may include a seed layer 120a that includes graphene and a metal migration barrier layer 120b that includes MXene.

The substrate 101 may include a material that supports semiconductor processes. For example, the substrate 101 may include a semiconductor, a conductor, or an insulator. Although not illustrated, at least one insulation layer may be disposed between the substrate 101 and the first conductive layer 110. The insulation layer may electrically insulate the substrate 101 from the first conductive layer 110.

The first conductive layer 110 including the first metal may be disposed on the substrate 101. The first conductive layer 110 may be, for example, a contact plug or a metal wiring. The first metal may include, for example, titanium (Ti), tantalum (Ta), tungsten (W), aluminum (Al), copper (Cu), or a combination of two or more thereof.

The interconnection structure 120 may be disposed on the first conductive layer 110. The interconnection structure 120 may form a connection portion between the first conductive layer 110 and the second conductive layer 130. That is, through the interconnection structure 120, a current may flow from the first conductive layer 110 to the second conductive layer 130, or flow from the second conductive layer 130 to the first conductive layer 110.

In an embodiment, the interconnection structure 120 may include a seed layer 120a disposed on the first conductive layer 110 and a metal migration barrier layer 120b disposed on the seed layer 120a. The seed layer 120a may function as a seed layer that can be used in a deposition method that forms the metal migration barrier layer 120b. The deposition method may include, for example, a chemical vapor deposition method, or an atomic layer deposition method.

Referring to FIG. 1, in some embodiments, the seed layer 120a may be disposed to be in contact with the entire first conductive layer 110. In other embodiments, however, the seed layer 120a may contact only a portion of the first conductive layer 110.

The seed layer 120a may include graphene. The graphene may be a two-dimensional material having conductivity. The seed layer 120a may include at least one layer or monolayer of graphene.

The metal migration barrier layer 120b may include MXene. The MXene may be a two-dimensional material having conductivity. The metal migration barrier layer 120b may include at least one layer or monolayer of MXene.

The MXene may include a two-dimensional material having a chemical formula of $M_{n+1}X_n$, where the n may be 1, 2 or 3. Examples of M may include scandium (Sc), titanium (Ti), zirconium (Zr), hafnium (Hf), vanadium (V), niobium (Nb), tantalum (Ta), chromium (Cr), molybdenum (Mo), tungsten (W), or a combination of two or more thereof. The X may include carbon (C), nitrogen (N), or a combination of two or more thereof. That is, the MXene may include, for example, transition metal carbide, transition metal nitride, or transition metal carbonitride. The metal migration barrier layer 120b may function as a barrier that inhibits movement of the first metal from the first conductive layer 110 to the second conductive layer 130, of the second metal from the second conductive layer 130 to the first conductive layer 110, or of both first and second metals between the first conductive layer 110 and the second conductive layer 130.

The seed layer 120a and the metal migration barrier layer 120b include conductive two-dimensional materials, so the interconnection structure 120, which is a stacked structure of the seed layer 120a and the metal migration barrier layer 120b, can effectively reduce the contact resistance at a connection portion between the first conductive layer 110 and the second conductive layer 130.

Referring to FIG. 1, the second conductive layer 130 including the second metal may be disposed on the interconnection structure 120. In an embodiment, the second conductive layer 130 may be a metal wiring electrically connected to the first conductive layer 110. The second metal may include, for example, titanium (Ti), tantalum (Ta), tungsten (W), aluminum (Al), copper (Cu), or a combination of two or more thereof.

As described above, a semiconductor device according to an embodiment of the present disclosure may include a first conductive layer including a first metal, a second conductive layer including a second metal, and an interconnection structure disposed at a connection portion that is located between the first and second conductive layers. The interconnection structure may include a seed layer that can include one or more single layers of graphene and a metal migration barrier layer that can include one or more single layers of MXene.

As a comparative example, when graphene, which is a conductive two-dimensional material, is a single interfacial layer used as the interconnection structure, the graphene may have a non-polar hydrophobic surface common to the first conductive layer. When the second conductive layer is formed on the hydrophobic surface by chemical vapor deposition or atomic layer deposition using a metal-organic precursor, the bonding force between the polar species of the metal-organic precursor and the hydrophobic surface may be weak. Accordingly, when forming the second conductive layer, defects may be generated at an interface between the graphene and the second conductive layer. Or, after forming the second conductive layer, a contact resistance at the interface between the graphene and the second conductive layer may increase. As a result, the mechanical stability and electrical stability at the interface may deteriorate.

Embodiments of the present disclosure, however, use MXene, which is a conductive two-dimensional material, in the interconnection structure in the form of an interface layer. The MXene may form a polar hydrophilic surface on the interface layer. The MXene may be surface-terminated by a functional group such as oxygen group (—O), a hydroxyl group (—OH), or fluorine group (—F), and the functional group may facilitate a hydrophilic surface. When the second conductive layer is formed on the hydrophilic surface of an interface layer using a metal-organic chemical vapor deposition (MOCVD) method, bonding forces between the polar species of the metal precursor and the hydrophilic surface may be strong. Accordingly, the mechanical stability at the interface between the MXene and the second conductive layer may be improved. By improving the mechanical stability, the movement of metal ions through the interface between the MXene layer and the second conductive layer can be prevented and undesirable effects due to electromigration can be reduced. In addition, as the mechanical stability at the interface is improved, the MXene, which is a conductive two-dimensional material, may reduce the contact resistance at the interface, thereby improving electrical stability.

According to an embodiment of the present disclosure, in order to conformally form an MXene layer on the first conductive layer, a seed layer including graphene may be used. The graphene may be more stably formed on the conductive layer or an insulating layer by a chemical vapor deposition method when compared to forming an MXene two-dimensional layer on a conductive layer or insulating layer. The graphene and MXene may include carbon (C) in common. Accordingly, the graphene may function as a seed layer for forming the MXene layer by a chemical vapor deposition method or an atomic layer deposition method. As a result, the MXene may be stably formed on the graphene.

Figure 2:
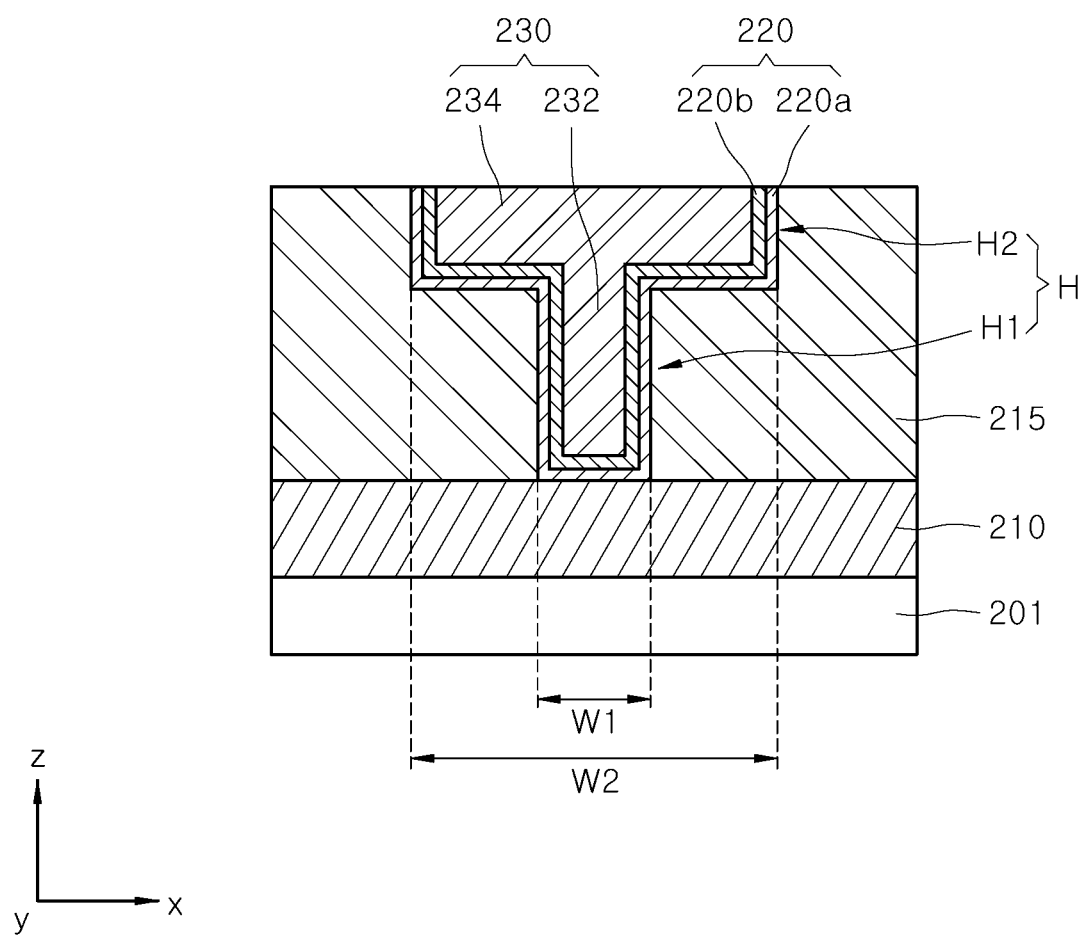
FIG. 2 is a cross-sectional view schematically illustrating a semiconductor device according to another embodiment of the present disclosure.

FIG. 2 is a cross-sectional view schematically illustrating a semiconductor device according to another embodiment of the present disclosure. Referring to FIG. 2, a semiconductor device 2 may include a substrate 201, a first conductive layer 210, which includes a first metal, located on the substrate 201. A second conductive layer 230, which includes a second metal, may be electrically connected to the first conductive layer 210. An interconnection structure 220 may contact a connection portion of each of the first and second conductive layers 210 and 230. The interconnection structure 220 may include a seed layer 220a that includes graphene and a metal migration barrier layer 220b that includes MXene.

The substrate 201 may include a material useful in semiconductor processes. For example, the substrate 201 may include a semiconductor, a conductor, or an insulator. Although not illustrated, at least one insulation layer may be disposed between the substrate 201 and the first conductive layer 210. The insulation layer may electrically insulate the first conductive layer 210 from the substrate 201.

The first conductive layer 210 may be, for example, a contact plug, a metal wiring, or a combination thereof. The first metal may include, for example, titanium (Ti), tantalum (Ta), tungsten (W), aluminum (Al), copper (Cu), or a combination of two or more thereof.

An interlayer insulation layer 215 may be disposed on the first conductive layer 210. The interlayer insulation layer 215 may include, for example, oxide, nitride, or oxynitride.

The interlayer insulation layer 215 may include a contact pattern H. In an embodiment, the contact pattern H may include a via hole pattern H1 and a trench pattern H2. The via hole pattern H1 may have a first width W1 and may expose a portion of the first conductive layer 210. The trench pattern H2 may be formed on the via hole pattern H1 and may extend in a direction (e.g., y-direction) in the interlayer insulation layer 215. The trench pattern H2 may have a second width W2 that is wider than the first width W1 in the x-direction.

Referring to FIG. 2, the interconnection structure 220 may be disposed inside the contact pattern H. The interconnection structure 220 may include the seed layer 220a including graphene and the metal migration barrier layer 220b including MXene.

The seed layer 220a may be disposed on a side surface and a bottom surface of the contact pattern H in a conformational manner. The seed layer 220a may contact the first conductive layer 210 and the interlayer insulation layer 215. The graphene may be a conductive two-dimensional material. The seed layer 220a may include at least one layer of graphene.

The metal migration barrier layer 220b may be disposed in a conformational manner on the seed layer 220a. The metal migration barrier layer 220b may be disposed to cover the seed layer 220a. The MXene may be a conductive two-dimensional material. The metal migration barrier layer 220b may include at least one layer of MXene.

Referring to FIG. 2, the second conductive layer 230, which includes the second metal, may fill the contact pattern H. The second conductive layer 230 may be disposed to contact the metal migration barrier layer 220b. The second conductive layer 230 may be, for example, a contact plug, a metal wiring, or a combination thereof. The second metal may include, for example, titanium (Ti), tantalum (Ta), tungsten (W), aluminum (Al), copper (Cu), or a combination of two or more thereof. The second conductive layer 230 may include a metal via 232 that fills the via hole pattern H1 and a metal wiring 234 that fills the trench pattern H2. The metal via 232 may function as a contact plug electrically connected to the first conductive layer 210. As shown in FIG. 2, a width of the metal wiring 234 in the trench pattern H2 is wider than a width of the metal via 232 in the via hole pattern H1 in y-direction.

In an embodiment, the first conductive layer 210 may be a tungsten (W) layer, and the second conductive layer 230 may be a copper (Cu) layer. In another embodiment, the first conductive layer 210 and the second conductive layer 230 may be copper (Cu) layers. The interconnection structure 220 may reduce the contact resistance at connection portions of the first conductive layer 210 and the second conductive layer 230. The interconnection structure 220 may serve to prevent movement of metal due to an electric field between the first conductive layer 210 and the second conductive layer 230 when the semiconductor device 2 is operating. An example of such movement under the electric field may include electromigration.

Figure 3:
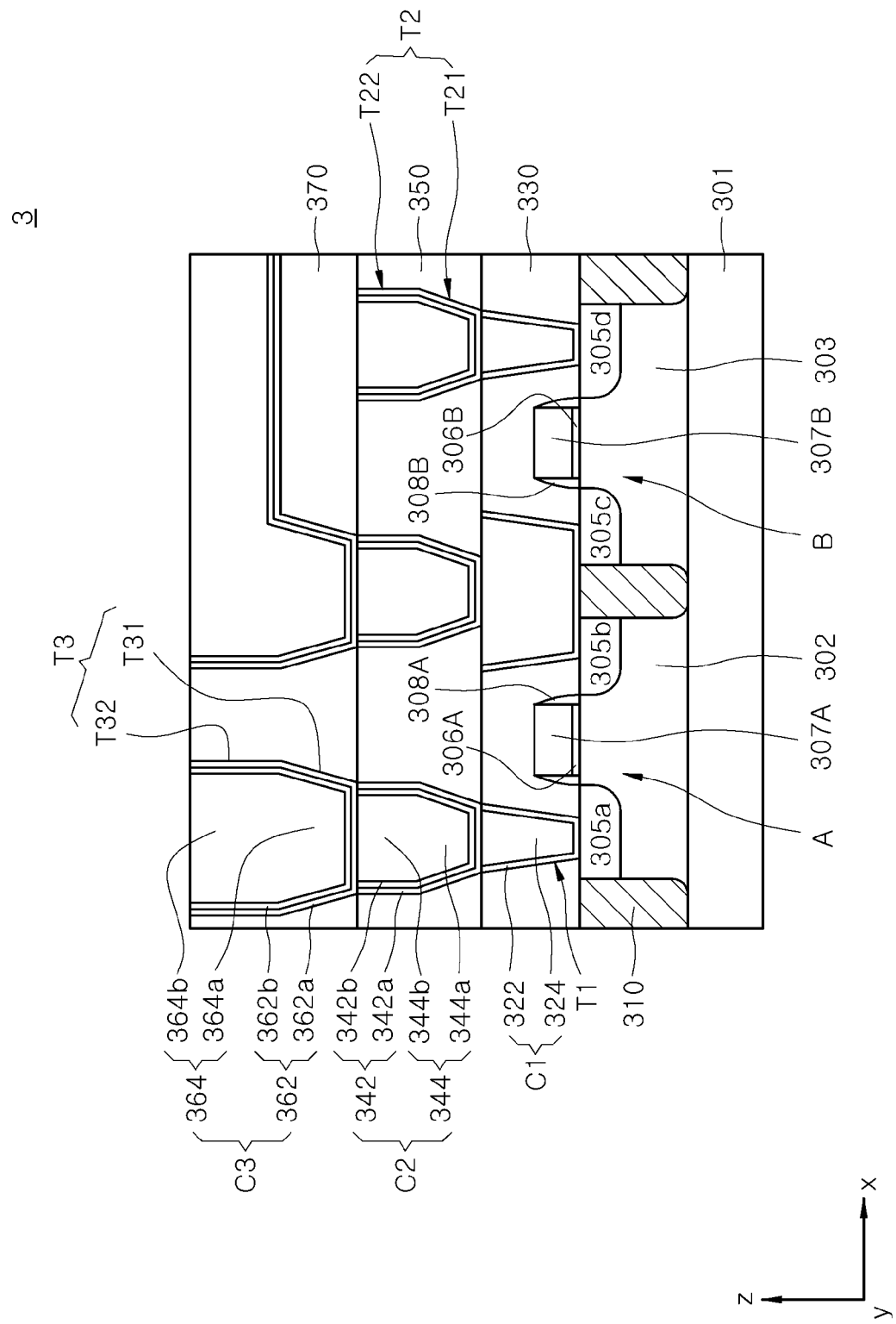
FIG. 3 is a cross-sectional view schematically illustrating a semiconductor device according to another embodiment of the present disclosure.

FIG. 3 is a cross-sectional view schematically illustrating a semiconductor device according to another embodiment of the present disclosure. Referring to FIG. 3, a semiconductor device 3 may include a substrate 301, first and second transistors A and B disposed over the substrate 301, and first to third wiring structures C1, C2, and C3 connected electrically to the first and second transistors A and B. The semiconductor device 3 may include first to third interlayer insulation layers 330, 350, and 370, which electrically insulate the first and second transistors A and B from the first to third wiring structures C1, C2, and C3 over the substrate 301.

The substrate 301 may include a semiconductor material. In addition, the substrate 301 may be doped with an n-type dopant or a p-type dopant. First and second doping wells 302 and 303 are doped with different dopants, respectively. Device isolation layers 310 may be disposed between, and on the sides of, the first doping well 302 and the second doping well 303. The first transistor A and the second transistor B may be disposed on the substrate 301, in locations corresponding to the first doping well 302 and the second doping well 303, respectively.

In an embodiment, the substrate 301 may be a p-type doped silicon (Si) substrate. The first doping well 302 may be a p-well doped with a p-type dopant, and the first transistor A may be an NMOS transistor. The first transistor A may include first and second doping regions 305*a* and 305*b*, which are doped with an n-type dopant. One of the first and second doping regions 305*a* and 305*b* may be a source region and the other may be a drain region. The first transistor A may include a gate dielectric layer 306A, a gate electrode 307A, and a sidewall spacer 308A.

Meanwhile, the second doping well 303 may be an N-well doped with an n-type dopant, and the second transistor B may be a PMOS transistor. The second transistor B may include first and second doping regions 305*c* and 305*d* doped with a p-type dopant. One of the first and second doping regions 305*c* and 305*d* may be a source region and the other may be a drain region. The second transistor B may include a gate dielectric layer 306B, a gate electrode 307B, and a sidewall spacer 308B.

Referring to FIG. 3 again, the first wiring structures C1 may be disposed on the first and second doping regions 305*a* and 305*b* of the first transistor A and the first and second doping regions 305*c* and 305*d* of the second transistor B. The first wiring structures C1 may be disposed in first contact patterns T1, which expose the first and second doping regions 305*a*, 305*b*, 305*c*, and 305*d* of the first and second transistors A and B in a first interlayer insulation layer 330. Each of the first wiring structures C1 may include a diffusion barrier layer 322, which is disposed on a side surface and a bottom surface of each of the first contact patterns T1. The diffusion barrier layer 322 may include, for example, titanium (Ti), titanium nitride (TiN), tantalum (Ta), tantalum nitride (TaN), or a combination thereof. In addition, each of the first wiring structures C1 may include a first conductive layer 324 that fills the first contact pattern T1 lined with the diffusion barrier layer 322. In an embodiment, the first conductive layer 324 may be a tungsten (W) layer.

Referring to FIG. 3, a second interlayer insulation layer 350 including second contact patterns T2 may be disposed over the first wiring structures C1. Each of the second contact patterns T2 may include a via hole pattern T21 and a trench pattern T22. The via hole patterns T21 may be disposed to selectively expose the first wiring structures C1. The trench patterns T22 may be disposed on the via hole patterns T21 and may extend, for example, in the y-direction.

The second wiring structures C2 may be disposed in the second contact patterns T2. Each of the second wiring structures C2 may include an interconnection structure 342 and a second conductive layer 344.

The interconnection structure 342 may include a seed layer 342*a* including graphene and a metal migration barrier layer 342*b* including MXene. The seed layer 342*a* including graphene may be disposed to conform along a side surface and bottom surface of the via hole pattern T21 and a side surface of the trench pattern T22. The metal migration barrier layer 342*b* may be disposed on the seed layer 342*a*. The material composition and arrangement of the seed layer 342*a* and the metal migration barrier layer 342*b* may be substantially the same as the material composition and arrangement of the seed layer 220*a* and the metal migration barrier layer 220*b* of a semiconductor device 2 described above with reference to FIG. 2.

The second conductive layer 344 may be disposed to fill the second contact pattern T2 that includes the interconnection structure 342. The second conductive layer 344 may include a metal via 344*a* that fills the via hole pattern T21 and a metal wiring 344*b* that fills the trench pattern T22 and extends, for example, in the y-direction. The configuration of the second conductive layer 344 may be substantially the same as that of the second conductive layer 230 of a semiconductor device 2 described above with reference to FIG. 2. The material composition of the conductive layers may vary. In an embodiment, the first conductive layer 324 may be a tungsten (W) layer, and the second conductive layer 344 may be a copper (Cu) layer, and the interconnection structure 342 may serve to reduce the contact resistance between the tungsten (W) layer and the copper (Cu) layer and block material exchange between the tungsten (W) layer and the copper (Cu) layer.

Referring to FIG. 3, a third interlayer insulation layer 370, including third contact patterns T3, may be disposed over the second interconnection structures C2. Each of the third contact patterns T3 may include a via hole pattern T31 and a trench pattern T32. The via hole patterns T31 may be disposed to selectively expose the second interconnection structures C2. The trench patterns T32 may be formed on the via hole patterns T31 to extend, for example, in the y-direction.

The third wiring structures C3 may be disposed in the third contact patterns T3. Each of the third wiring structures C3 may include an interconnection structure 362 and a third conductive layer 364.

The interconnection structure 362 may include a seed layer 362*a* including graphene and a metal migration barrier layer 362*b* including MXene. The seed layer 362*a* including graphene may be disposed to conform along a side surface and bottom surface of the via hole pattern T31 and a side surface of the trench pattern T32. The metal migration barrier layer 362*b* may be disposed on the seed layer 362*a*. The material composition and arrangement of the seed layer 362*a* and the metal migration barrier layer 362*b* may be substantially the same as the material composition and arrangement of the seed layer 220*a* and the metal migration barrier layer 220*b* of a semiconductor device 2 described above with reference to FIG. 2.

The third conductive layer 364 may be disposed to fill the third contact pattern T3 including the interconnection structure 362. The third conductive layer 364 may include a metal via 364*a* filling the via hole pattern T31 and a metal wiring 364*b* filling the trench pattern T32 and extending, for example, in the y-direction. The configuration of the third conductive layer 364 may be substantially the same as that of a second conductive layer 230 of the semiconductor device 2 described above with reference to FIG. 2. In an embodiment, the second conductive layer 344 and the third conductive layer 364 may be copper (Cu) layers, and the interconnection structure 362 may serve to reduce the contact resistance between the copper (Cu) layers and block copper (Cu) movement between the second and third conductive layers 344 and 364.

FIGS. 4A to 4D are cross-sectional views schematically illustrating a method of manufacturing a semiconductor device according to an embodiment of the present disclosure.

Figure 4A:
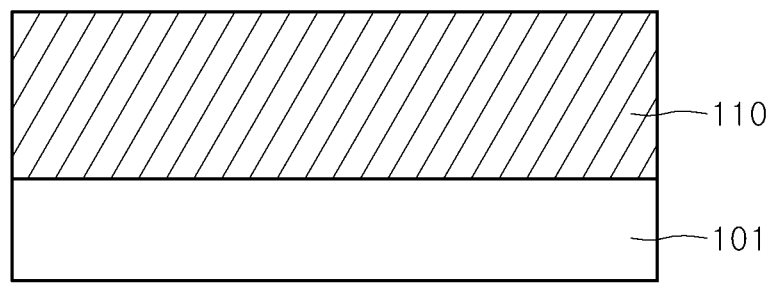
FIGS. 4A to 4D are cross-sectional views schematically illustrating a method of manufacturing a semiconductor device according to an embodiment of the present disclosure.
Figure 4A:
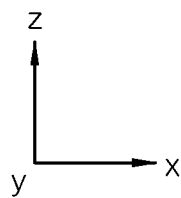

Referring to FIG. 4A, a substrate 101 may be provided. The substrate 101 may include a semiconductor material used in semiconductor processes. As an example, the substrate 101 may include a semiconductor, a conductor, or an insulator.

Next, a first conductive layer 110 including a first metal may be formed on the substrate 101. The first conductive layer 110 may be, for example, a contact plug, a metal wiring, or a combination thereof. The first metal may include, for example, titanium (Ti), tantalum (Ta), tungsten (W), aluminum (Al), copper (Cu), or a combination of two or more thereof. The first conductive layer 110 may be formed by, for example, a chemical vapor deposition method, a sputtering method, an atomic layer deposition method, or the like.

Figure 4B:
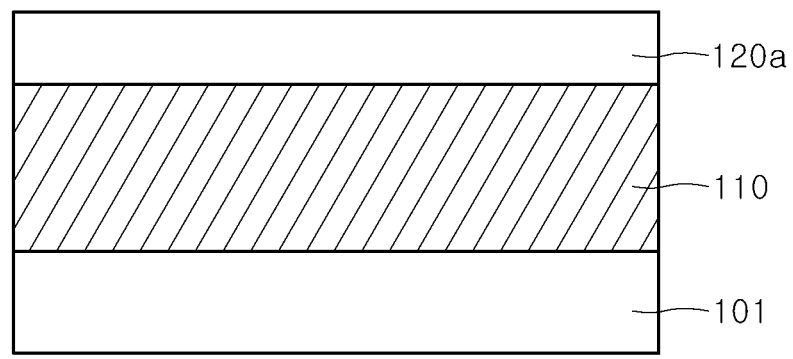

Referring to FIG. 4B, a seed layer 120a including graphene may be formed on at least a portion of the first conductive layer 110. In FIG. 4B, the seed layer 120a is formed to cover the entire conductive layer 110, but embodiments are not limited to this illustration. In other embodiments, the seed layer 120a may be formed on a portion of the first conductive layer 110.

In an embodiment, the seed layer 120a may have a structure in which at least one layer of graphene, which is a two-dimensional material, is stacked on the first conductive layer. A single layer of graphene may be formed on the first conductive layer 110 by a chemical vapor deposition method. As an example, the graphene layer may be formed by using methane ($CH_4$) as a reactive gas in a gas atmosphere including argon (Ar), hydrogen (H), or a combination thereof and a process temperature of 400° C. to 1000° C. In an embodiment, the seed layer 120a may be formed by sequentially stacking the graphene, which is a two-dimensional material, layer by layer. The stacked graphene layers may each be formed using a chemical vapor deposition method.

Figure 4C:
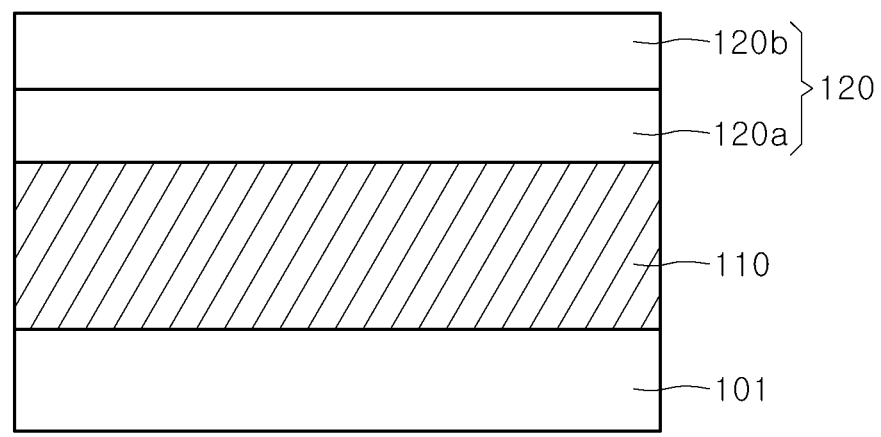

Referring to FIG. 4C, a metal migration barrier layer 120b including MXene may be formed on the seed layer 120a. The metal migration barrier layer 120b may include at least one layer of MXene.

MXene may refer to a two-dimensional material having a chemical formula of $M_{n+1}X_n$, where n may be 1, 2 or 3, and the M may include for example scandium (Sc), titanium (Ti), zirconium (Zr), hafnium (Hf), vanadium (V), niobium (Nb), tantalum (Ta), chromium (Cr), molybdenum (Mo), tungsten (W), or a combination of two or more thereof. The X may include carbon (C), nitrogen (N), or a combination of two or more thereof. That is, the MXene may include, for example, transition metal carbide, transition metal nitride, or transition metal carbonitride.

In an embodiment, the metal migration barrier layer 120b may include a structure in which at least one layer of MXene, which is a two-dimensional material, is stacked. Sequentially stacked MXene layers may be formed on the seed layer 120a by a chemical vapor deposition method or an atomic layer deposition method. As an example, the MXene may be formed using a source material including transition metal and a reaction gas including hydrocarbon, such as forming two-dimensional (2D) molybdenum carbide on 2D graphene using a molybdenum source and a methane gas. The seed layer 120a including graphene and the metal migration barrier layer 120b including MXene, formed using the above-described methods, may constitute an interconnection structure 120.

Figure 4D:
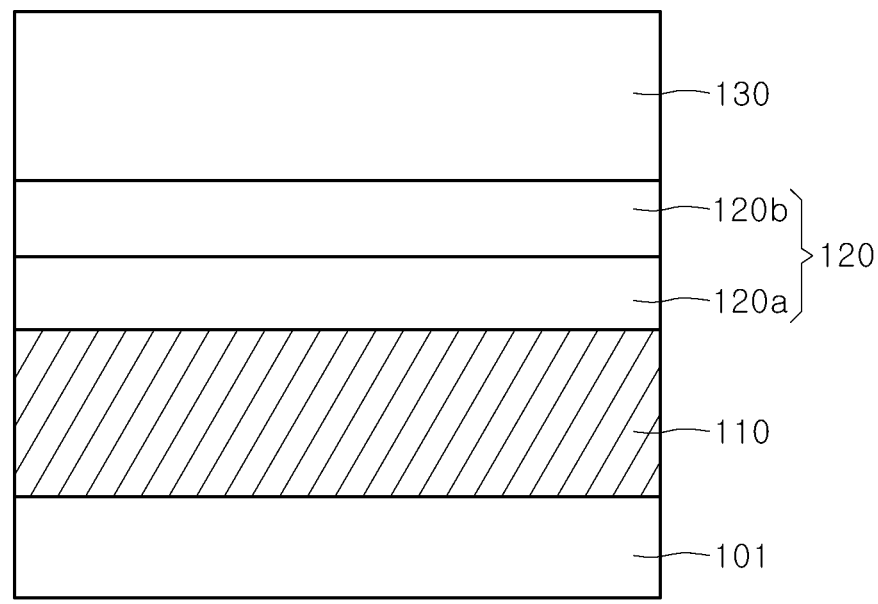

Referring to FIG. 4D, a second conductive layer 130 including a second metal may be formed on the metal migration layer 120b. The second conductive layer 130 may be a contact plug, a metal wiring, or a combination thereof that is electrically connected to the first conductive layer 110. The second metal may include, for example, titanium (Ti), tantalum (Ta), tungsten (W), aluminum (Al), copper (Cu), or a combination of two or more thereof.

In an embodiment, the second conductive layer 130 may be formed by a chemical vapor deposition method or an atomic layer deposition method using a metal-organic precursor. In an embodiment, the second conductive layer 130 may be a copper (Cu) layer. The metal-organic precursor for forming the copper (Cu) layer may include, for example, copper aminoalkoxide, copper amidinate, copper β-diketonate, copper diacetylacetonate, or the like. By performing the above-described processes of FIGS. 4A to 4D, a semiconductor device according to an embodiment of the present disclosure may be manufactured.

FIGS. 5A to 5E are cross-sectional views schematically illustrating a method of manufacturing a semiconductor device according to another embodiment of the present disclosure.

Figure 5A:
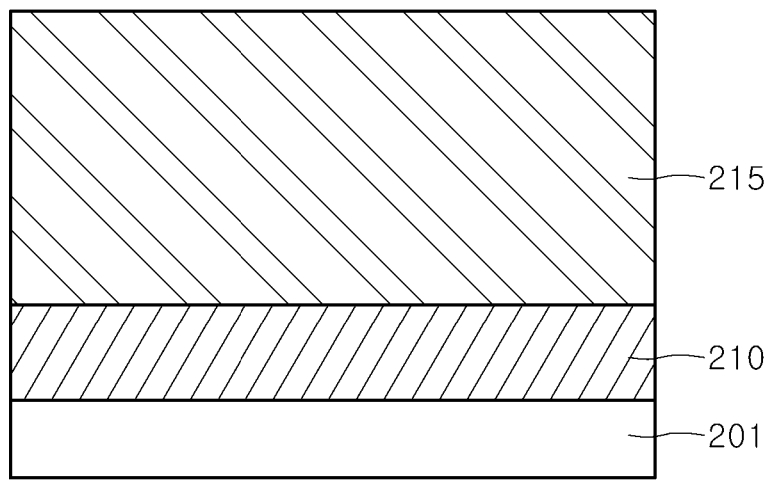
FIGS. 5A to 5E are cross-sectional views schematically illustrating a method of manufacturing a semiconductor device according to another embodiment of the present disclosure.
Figure 5A:
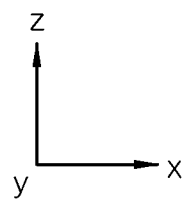

Referring to FIG. 5A, a substrate 201 may be provided. The configuration of the substrate 201 may be substantially the same as that of a substrate 101 of FIG. 4A. A first conductive layer 210 including first metal may be formed on the substrate 201. The configuration of the first conductive layer 210 may be substantially the same as that of a first conductive layer 110 including a first metal of FIG. 4A. Although not illustrated, at least one insulation layer may be formed between the substrate 201 and the first conductive layer 210. The insulation layer may electrically insulate the first conductive layer 210 from the substrate 201.

Next, an interlayer insulation layer 215 may be formed on the first conductive layer 210. The interlayer insulation layer 215 may include, for example, oxide, nitride, or oxynitride. The interlayer insulation layer 215 may be formed by, for example, a chemical vapor deposition method, a sputtering method, or a coating method.

Figure 5B:
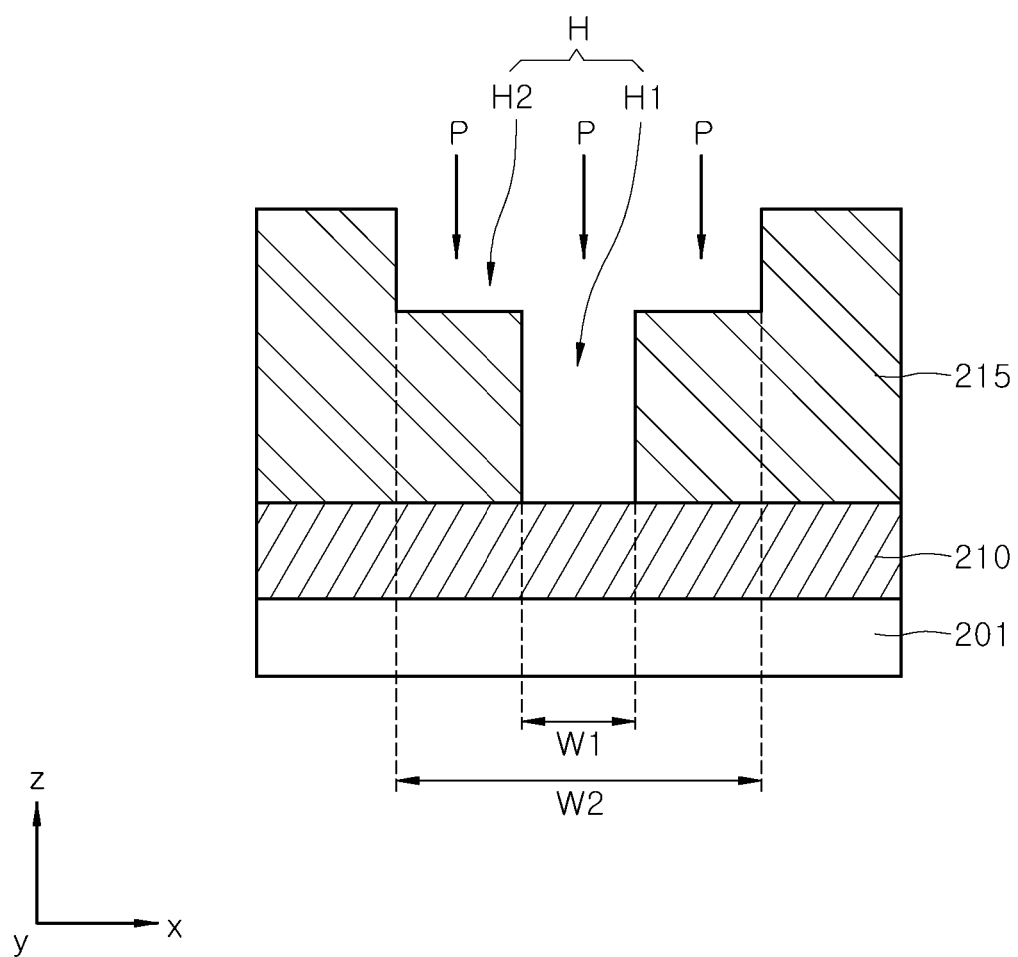

Referring to FIG. 5B, the interlayer insulation layer 215 may be patterned (P) to form a contact pattern H. The contact pattern H may include a via hole pattern H1 and a trench pattern H2. The via hole pattern H1 may have a first width W1 and expose a portion of the first conductive layer 210. The trench pattern H2 may be formed to expose the via hole pattern H1 and to extend in a direction (e.g., y-direction). The trench pattern H2 may have a second width W2, which is wider than the first width W1 in the x-direction.

Figure 5C:
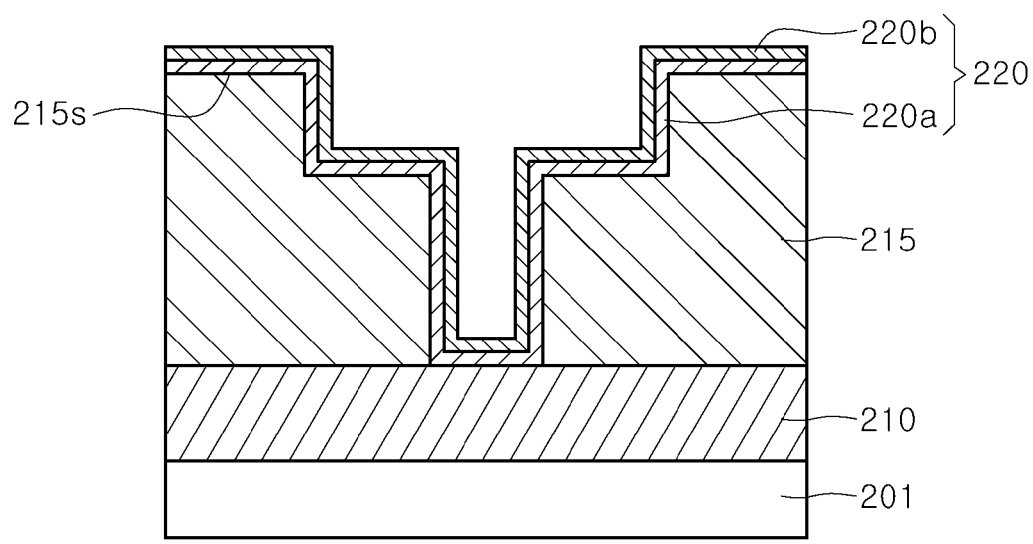

Referring to FIG. 5C, a seed layer 220a including graphene may be formed on a side surface and bottom surface of the contact pattern H. In addition, the seed layer 220a may additionally be formed on an upper surface 215S of the interlayer insulation layer 215 located outside the contact pattern H. The seed layer 220a, which includes graphene, may contact the first conductive layer 210 and the interlayer insulation layer 215. The graphene may be a conductive two-dimensional material. The seed layer 220a may include at least one layer of graphene. The method of forming the seed layer 220a may be substantially the same as a method of forming a seed layer 120a described above with reference to FIG. 4B.

Next, a metal migration barrier layer 220b including MXene may be formed on the seed layer 220a. The metal migration barrier layer 220b may be formed to cover the seed layer 220a. As illustrated in FIG. 5C, the metal migration barrier layer 220b may be formed on the seed layer 220a located both inside and outside the contact pattern H.

The MXene may be a conductive two-dimensional material. The metal migration barrier layer 220b may include at least one layer of MXene. The method of forming the metal migration barrier layer 220b may be substantially the same as a method of forming a metal migration barrier layer 120b described-above with reference to FIG. 4C.

Figure 5D:
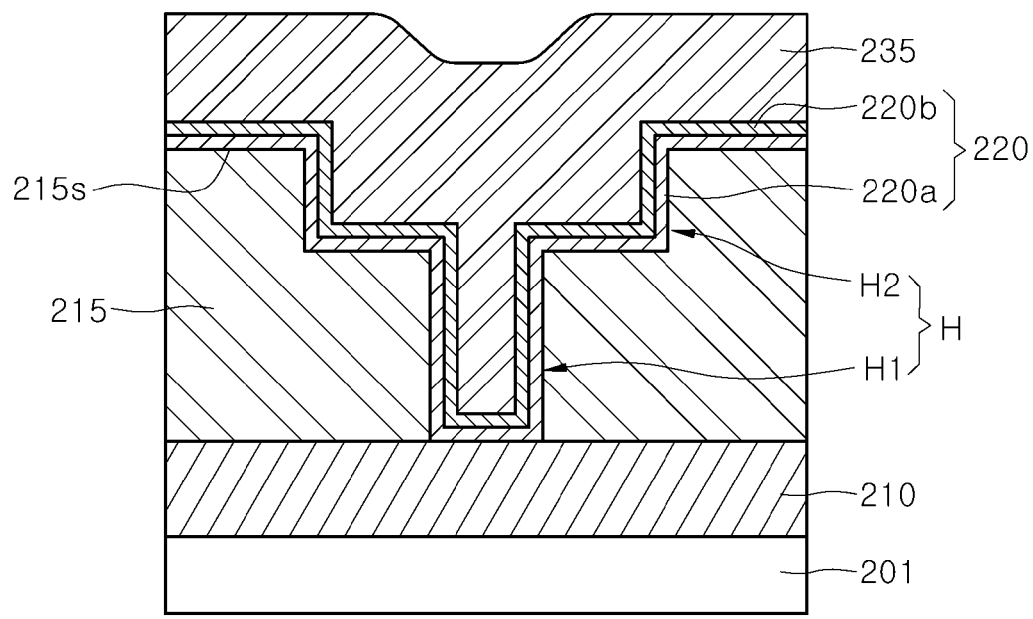

Referring to FIG. 5D, a conductive material layer 235 including a second metal may be formed inside the contact pattern H. The second metal may include, for example, titanium (Ti), tantalum (Ta), tungsten (W), aluminum (Al), copper (Cu), or a combination of two or more thereof.

The conductive material layer 235 may be formed to fill the contact pattern H in the interlayer insulation layer 215 and formed outside the contact pattern H on the metal migration barrier layer 220b. The method of forming the conductive material layer 235 may be substantially the same as a method of forming a second conductive layer 130 described above with reference to FIG. 4D.

Figure 5E:
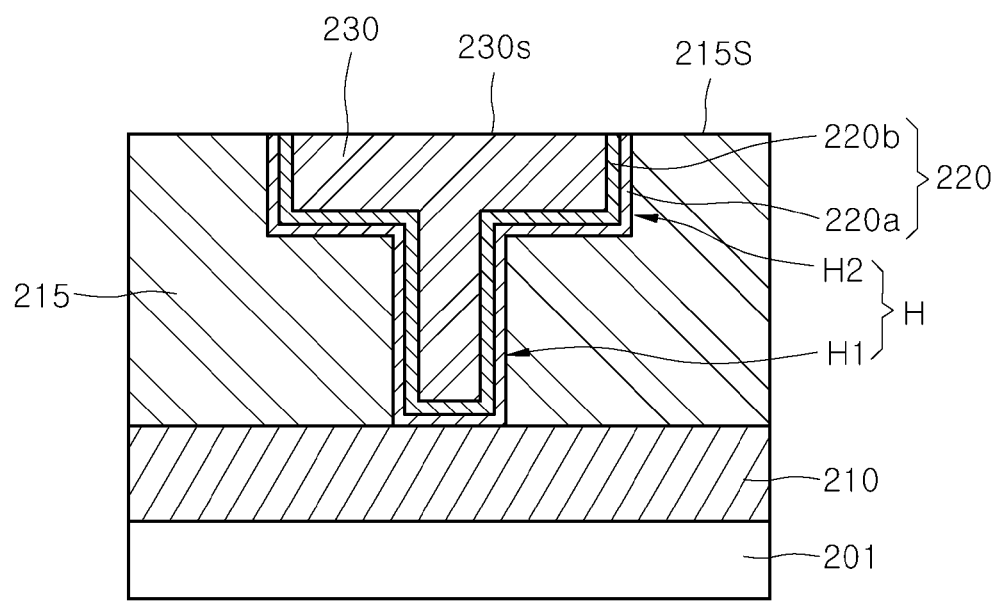

Referring to FIG. 5E, an upper portion of the conductive material layer (235 of FIG. 5D) may be planarized. That is, the conductive material layer (235 of FIG. 5D), the metal migration barrier layer 220b, and the seed layer 220a located outside the contact pattern H may be removed. The removal of the conductive material layer (235 of FIG. 5D), the metal migration barrier layer 220b, and the seed layer 220a located outside the contact pattern H may be performed using, for example, a chemical mechanical polishing method or an etch back process, and as a result, a second conductive layer 230 may be formed. Also as a result of planarization, an upper surface 230S of the second conductive layer 230 may be disposed on the same plane as an upper surface 215S of the interlayer insulation layer 215.

By performing the processes of FIGS. 5A to 5E, semiconductor devices according to embodiments of the present disclosure may be manufactured. The processes of FIGS. 5A to 5E may be applied to manufacture a semiconductor device 2 described above with reference to FIG. 2 and a semiconductor device 3 described with reference to FIG. 3.

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A semiconductor device comprising:
   a first conductive layer including a first metal;
   a second conductive layer that is electrically connected to the first conductive layer and that includes a second metal; and
   an interconnection structure disposed in a connection portion between the first conductive layer and the second conductive layer,
   wherein the interconnection structure comprises:
   a seed layer disposed on the first conductive layer, the seed layer including graphene; and
   a metal migration barrier layer disposed on the seed layer, the metal migration barrier layer including MXene,
   wherein the metal migration barrier layer has a polar hydrophilic surface, and
   wherein the second conductive layer is disposed on the polar hydrophilic surface of the metal migration barrier layer.

2. The semiconductor device of claim 1, wherein the metal migration barrier layer is disposed to contact the second conductive layer.

3. The semiconductor device of claim 1, wherein each of the first metal and the second metal comprises at least one selected from the group consisting of titanium (Ti), tantalum (Ta), tungsten (W), aluminum (Al), and copper (Cu).

4. The semiconductor device of claim 1, wherein the seed layer is disposed to contact at least a portion of the first conductive layer.

5. The semiconductor device of claim 1, wherein the graphene is a two-dimensional material having conductivity, and
   wherein the seed layer comprises at least one layer of graphene.

6. The semiconductor device of claim 1, wherein the MXene is a two-dimensional material having conductivity, and
   wherein the metal migration barrier layer comprises at least one layer of the MXene.

7. The semiconductor device of claim 1, wherein the MXene comprises a two-dimensional material having a chemical formula of $M_{n+1}X_n$ and
   wherein n is 1, 2 or 3, and M comprises at least one selected from the group consisting of scandium (Sc), titanium (Ti), zirconium (Zr), hafnium (Hf), vanadium (V), niobium (Nb), tantalum (Ta), chromium (Cr), molybdenum (Mo), and tungsten (W), and X comprises at least one selected from carbon (C) and nitrogen (N).

8. A semiconductor device comprising:
   a substrate;
   a first conductive layer, including a first metal, on the substrate;
   an interlayer insulation layer disposed on the first conductive layer, the interlayer insulation layer including a contact pattern;
   a seed layer, including graphene, disposed to contact the first conductive layer in the contact pattern;
   a metal migration barrier layer, including MXene, disposed on the seed layer; and
   a second conductive layer including a second metal and disposed to contact the metal migration barrier layer,
   wherein the metal migration barrier layer has a polar hydrophilic surface,
   wherein the second conductive layer is disposed on the polar hydrophilic surface of the metal migration barrier layer.

9. The semiconductor device of claim 8, wherein each of the first metal and the second metal comprises at least one selected from the group consisting of titanium (Ti), tantalum (Ta), tungsten (W), aluminum (Al), and copper (Cu).

10. The semiconductor device of claim 8, wherein the graphene is a two-dimensional material having conductivity, and
    wherein the seed layer comprises at least one layer of graphene.

11. The semiconductor device of claim 8, wherein the MXene is a two-dimensional material having conductivity, and
    wherein the metal migration barrier layer comprises at least one layer of the MXene.

12. The semiconductor device of claim 8, wherein the MXene comprises a two-dimensional material having a chemical formula of $M_{n+1}X_n$, and
    wherein n is 1, 2 or 3, and M comprises at least one selected from the group consisting of scandium (Sc), titanium (Ti), zirconium (Zr), hafnium (Hf), vanadium (V), niobium (Nb), tantalum (Ta), chromium (Cr), molybdenum (Mo), and tungsten (W), and X comprises at least one selected from carbon (C) and nitrogen (N).

* * * * *